(12) United States Patent
Ikeda et al.

(10) Patent No.: US 8,368,084 B2
(45) Date of Patent: Feb. 5, 2013

(54) SEMICONDUCTOR DEVICE WITH CAPACITOR DISPOSED ON GATE ELECTRODE

(75) Inventors: Kentaro Ikeda, Kanagawa (JP); Masahiko Kuraguchi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1 day.

(21) Appl. No.: 12/876,598

(22) Filed: Sep. 7, 2010

(65) Prior Publication Data

US 2011/0220978 A1   Sep. 15, 2011

(30) Foreign Application Priority Data

Mar. 10, 2010   (JP) .................. 2010-053690

(51) Int. Cl.
*H01L 29/772* (2006.01)
(52) U.S. Cl. .................. 257/77; 257/296; 257/E27.016
(58) Field of Classification Search ............ 257/77, 257/296, E27.016
See application file for complete search history.

(56) References Cited

U.S. PATENT DOCUMENTS

| 4,394,590 A | * | 7/1983 | Honda | 327/436 |
| 6,563,366 B1 | * | 5/2003 | Kohama | 327/382 |

FOREIGN PATENT DOCUMENTS

| JP | 2008-235952 | 10/2008 |
| JP | 2009-218528 | 9/2009 |

OTHER PUBLICATIONS

U.S. Appl. No. 12/881,842, filed Sep. 14, 2010, Ikeda, et al.
Japanese Office Action issued Jan. 31, 2012 in patent application No. 2010-053690 with English translation.
Japanese Office Action issued May 22, 2012 in patent application No. 2010-053690 with English translation.

* cited by examiner

*Primary Examiner* — Wensing Kuo
(74) *Attorney, Agent, or Firm* — Oblon, Spivak, McClelland, Maier & Neustadt, L.L.P.

(57) ABSTRACT

In an embodiment, provided is a semiconductor device in which a normally-on type FET; a capacitor having one electrode electrically connected to a gate of the FET and the other electrode electrically connected to an input terminal; and a diode having an anode electrode electrically connected to the gate of the FET and a cathode electrode electrically connected to a source of the FET are formed on the same chip on which the FET is formed. Also, the capacitor may have a structure in which an insulation film such as a dielectric substance is formed on a gate drawn electrode of the FET, and a metallic layer is formed on the insulation layer.

5 Claims, 8 Drawing Sheets

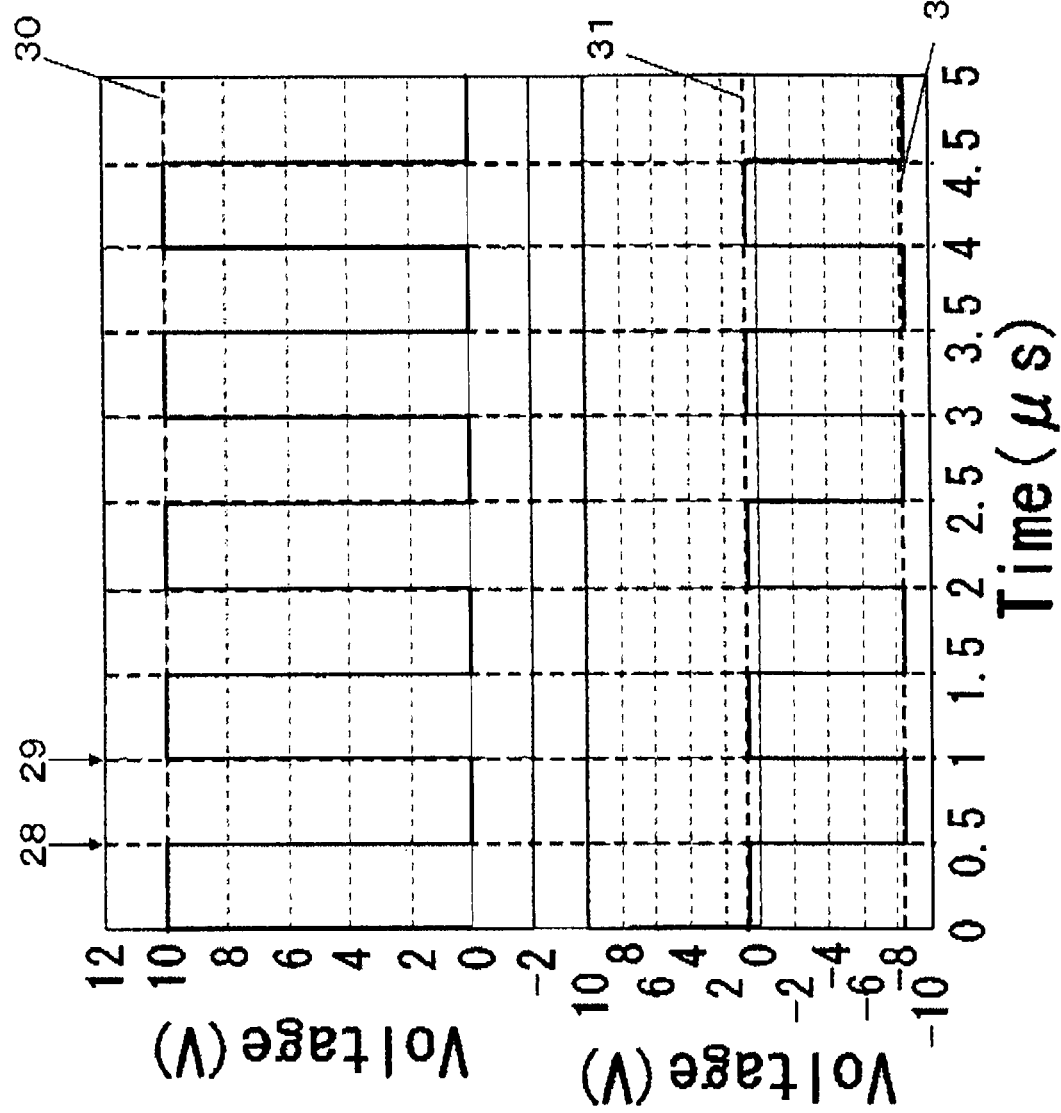

SEMICONDUCTOR DEVICE WITH CAPACITOR DISPOSED ON GATE ELECTRODE

CROSS-REFERENCE TO RELATED APPLICATION

This application is based upon and claims the benefit of priority from the prior Japanese Patent applications No. JP2010-053690, filed on 10.3.2010; the entire contents of (all of) which are incorporated herein by reference.

FIELD

Embodiments described herein relate generally to a semiconductor device using a switching element of a normally-on operation.

BACKGROUND

Wide gap semiconductors such as GaN, SiC, or diamond have the feature in which important factors such as dielectric breakdown voltage, electron mobility, and thermal conductivity in a semiconductor device are excellent compared with Si. An HEMT having an AlGaN/GaN hetero structure, which is a type of GaN semiconductor devices, has attracted much attention since the HEMT has the characteristics such as high-frequency performance and low on-resistance originated from its high electron mobility and carrier density. Further, since the HEMT having the AlGaN/GaN hetero structure has the (normally-on) characteristics that the current flows without the application of the gate voltage, a negative voltage needs to be applied to the gate in order to turn off the element, that is, to stop the current.

For this reason, the negative power supply is needed, which causes problems that the number of components of the circuit increases and the wiring of the circuit board becomes complex.

As a circuit that omits the negative power supply, for example, a circuit which includes an oscillator outputting a control signal for turning on or off the HEMT element, a capacitor disposed between a control signal output terminal of the oscillator and a gate of the HEMT element, and a diode disposed between the capacitor and a source of the HEMT element may be supposed. However, this circuit has drawbacks in which the diode and the capacitor having a large capacitance of 10 to 500 times the input capacitance of the FET are needed to be provided outside, in addition to the semiconductor device, and the number of components provided outside the switching element increases. There is also a problem that voltage oscillation (ringing) is generated by parasitic inductances produced in accordance with an increase in the wiring length from the driving circuit of the switching element to the gate of the switching element.

BRIEF DESCRIPTION OF THE DRAWINGS

FIG. 3A is a diagram illustrating a driving signal of the semiconductor device according to the embodiment;

FIG. 3B is a diagram illustrating a gate voltage of an FET;

DETAILED DESCRIPTION

Figure 1A:
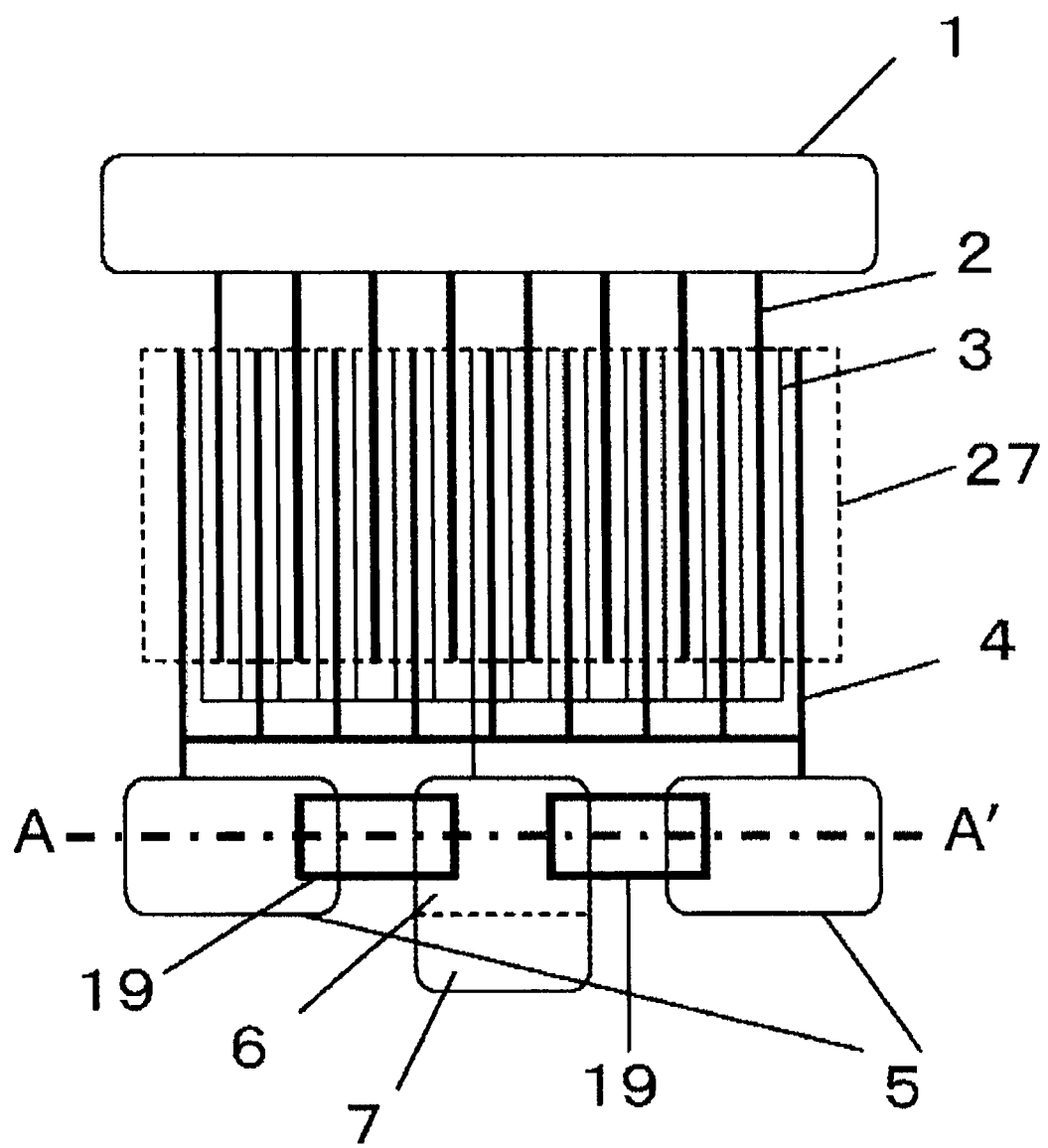
FIG. 1A is a bird's eye view illustrating a semiconductor device according to an embodiment.

As described above, in embodiments, there is a problem that the number of components such as a capacitor having a large capacitance or a diode provided to the normally-on switching element is increased, and voltage oscillation (ringing) is generated by parasitic inductances produced in accordance with an increase in the wiring length from the driving circuit of the normally-on switching element to the gate of the normally-on switching element. According to the embodiments, it is possible to provide a switching element capable of performing a switching operation by only a semiconductor device without providing a negative power supply.

That is, the semiconductor device according to the embodiment includes a normally-on type FET, a capacitor having one electrode electrically connected to a gate of the FET and the other electrode electrically connected to an input terminal, and a diode having an anode electrode electrically connected to the gate of the FET and a cathode electrode electrically connected to a source of the FET. The capacitor is formed by forming a metallic layer on a gate drawn electrode of the FET with a dielectric insulation layer interposed therebetween.

The FET, the capacitor, and the diode are formed on the same chip.

Since the capacitor having a sufficient capacitance is disposed on the gate drawn electrode and the diode is disposed on the same chip along with the normally-on type FET, a switching operation can be performed by only a semiconductor device using a single power supply.

That is, according to the embodiments, a switching operation can be performed by only the semiconductor device including the normally-on type FET using a single power supply. Further, since the circuit board becomes compact and the wiring length remarkably becomes short due to a decrease in the number of components, the occurrence of ringing can be suppressed.

Hereinafter, first to fourth embodiments will be described with reference to the accompanying drawings. In the following description of the drawings, the same or similar reference numerals will be given to the same or similar components.

First Embodiment

Figure 1B:
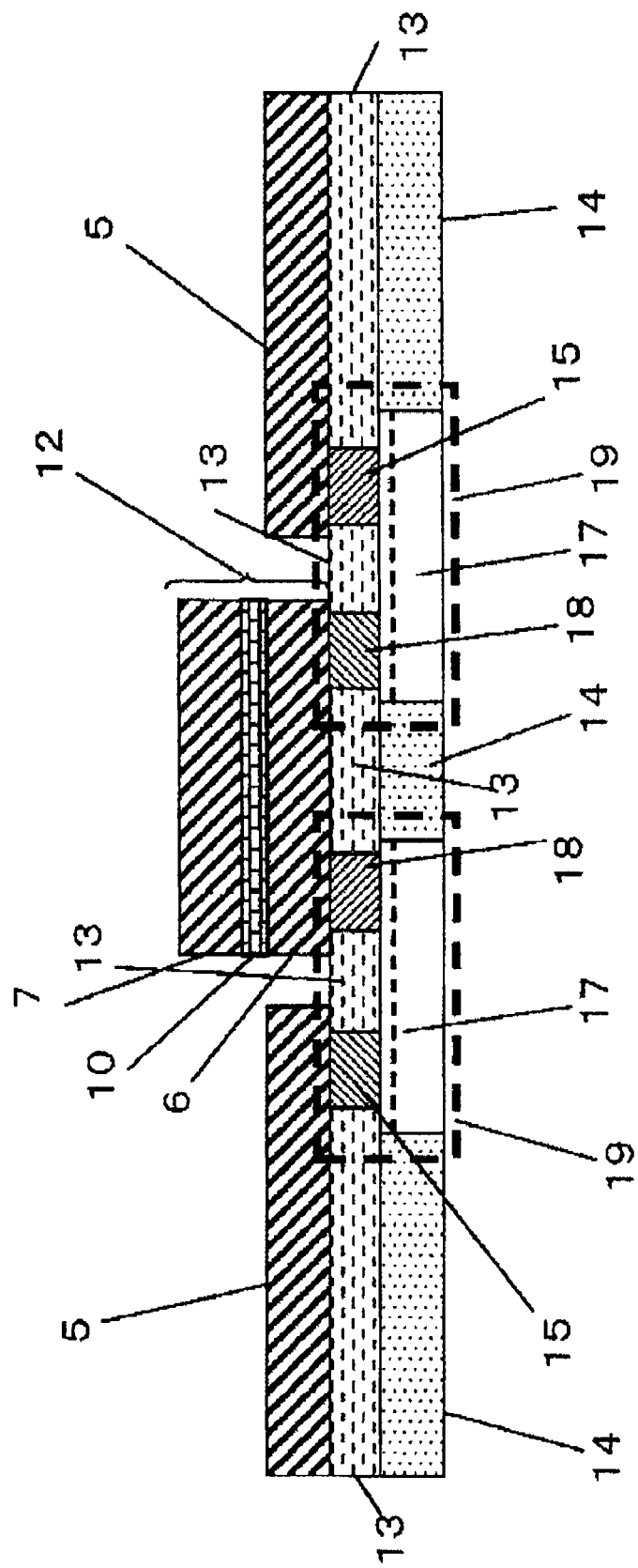
FIG. 1B is a cross-sectional view illustrating the semiconductor device of FIG. 1A.

A configuration of a semiconductor device according to a first embodiment will be described with reference to FIGS. 1A to 4B. FIG. 1A is a bird's eye view illustrating the semiconductor device according to the first embodiment, and FIG. 1B is a cross-sectional view taken along the line A-A' of FIG. 1A.

The semiconductor device of this embodiment includes an FET section 27, a drain electrode pad 1 of the FET, a source electrode pad 5, a bonding gate electrode pad 7, a gate electrode drawn pad 6, and a diode 19 formed between the gate electrode drawn pad 6 and the source electrode pad 5. A capacitor 12 is formed in such a manner that a dielectric insulation film 10 is formed beneath the bonding gate electrode pad 7, and the gate electrode drawn pad 6 and the bonding gate electrode pad 7 are electrically insulated from each other.

The dielectric insulation film may be formed of $SiO_2$, SiN, $Al_2O_3$, $TiO_2$, $BaTiO_3$, $SrTiO_3$, (Ba, Sr) $TiO_3$, $Ta_2O_5$, $LiTaO_3$, $HfO_2$, $ZrO_2$, or the like.

The gate electrode drawn pad 6 is electrically connected to a gate electrode 3. A drain electrode 2 is electrically connected to the drain electrode pad 1, and a source electrode 4 is electrically connected to the source electrode pad 5. The diode 19 includes an anode electrode 18 which comes into Schottky contact with a nitride semiconductor 17, a cathode electrode 15 which comes into ohmic contact with the nitride semiconductor 17, and the nitride semiconductor 17. The anode electrode 18 is electrically connected to the gate electrode drawn 6, and the cathode electrode 15 is electrically connected to the source electrode pad 5. The source electrode pad 5 is insulated by an interlayer insulation film 13. The source electrode pad 5 may be insulated from the nitride semiconductor excluding the diode section. For example, when the nitride semiconductor is insulated by isolation, the interlayer insulation film 13 may be omitted. The nitride semiconductor excluding the FET section and the diode section is insulated by isolation. The isolation can be performed by mesa forming via etching or ion implanting.

Figure 2:
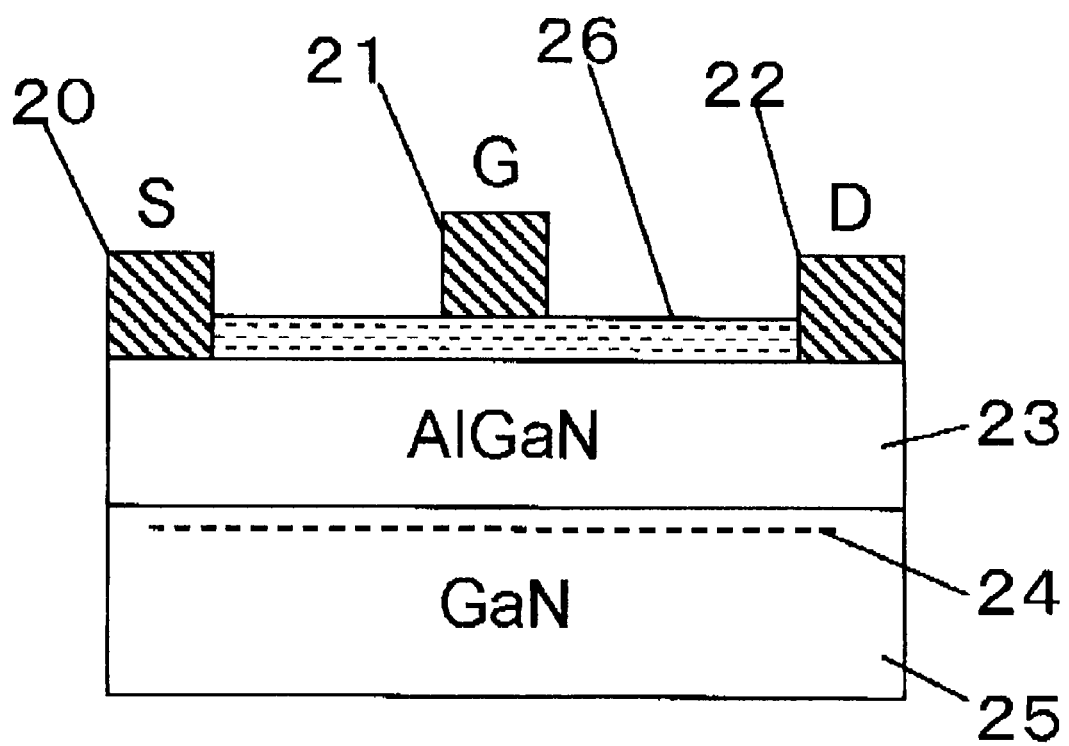
FIG. 2 is a cross-sectional view illustrating an example of a nitride semiconductor HEMT.
Figures 4A, 4B:
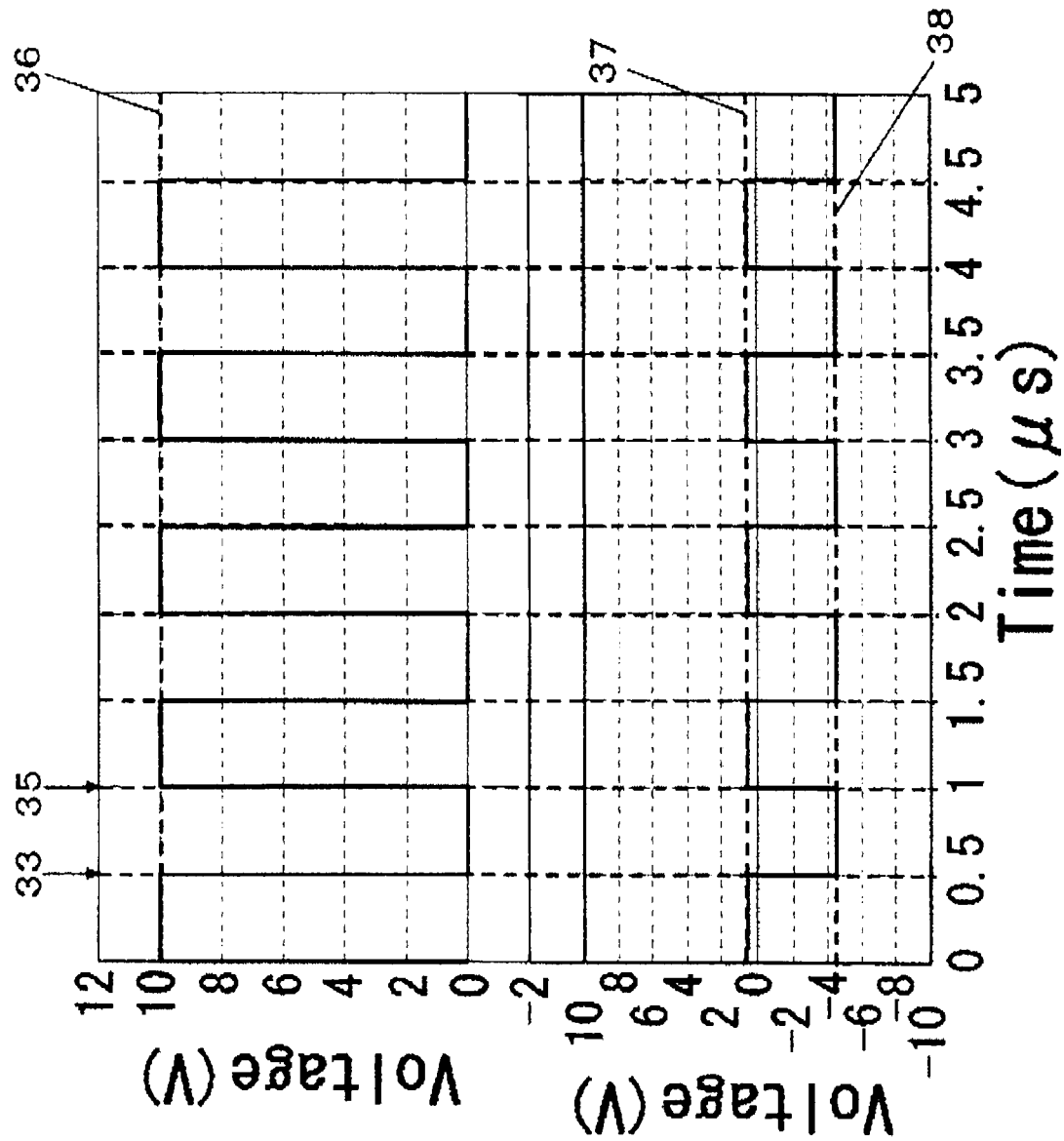
FIG. 4A is a diagram illustrating a driving signal of the semiconductor device according to the embodiment.
FIG. 4B is a diagram illustrating a gate voltage of the FET.

FIG. 2 is a cross-sectional view illustrating an example of a normally-on type FET section 27 formed of a nitride semiconductor. An AlGaN layer 23 is laminated on a GaN layer 25, and a source electrode 20 and a drain electrode 22 are formed on the AlGaN layer 23. In addition, a gate insulation film 26 is formed on the AlGaN layer 23, and a gate electrode 21 is formed on the gate insulation film 26.

The gate insulation film 26 may be formed of $SiO_2$, SiN, $Al_2O_3$, $TiO_2$, $Ta_2O_5$, $HfO_2$, $ZrO_2$, or the like. The gate insulation film 26 can suppress the occurrence of gate leakage current. Two-dimensional electron gas 24 produced by heterojunction of the GaN layer 25 and the AlGaN layer 23 is controlled by the gate electrode 21, thereby performing a transistor operation.

In this embodiment, a normally-on type element is used as the FET. In this example, the nitride semiconductor having the structure in which the AlGaN layer 23 is laminated on the GaN layer 25 is used, but a semiconductor material having any combination ratio between AlGaN, InAlN, GaN, AlGaN, and the like may be used. For example, not only the heterojunction but also a superlattice structure, a structure having a plurality of heterojunctions, or a structure having gradient composition can be used as long as the FET operation can be performed by the nitride semiconductor or SiC, and the embodiment is not particularly limited to the structure shown in FIG. 2. The FET section 27 has a structure in which a plurality of the normally-on type FETs shown in FIG. 2 is disposed to be connected to each other in parallel.

FIGS. 3A and 3B are a diagram illustrating the operation of the FET inside the semiconductor device according to this embodiment, which shows the simulation results of the device driving signal and the gate voltage of the FET section. The driving signal is shown in FIG. 3A. The driving signal for simulation is a 1 MHz rectangular wave having a low level of 0 V and a high level of 10 V, and the capacitance of the capacitor of this example is 9 times the input capacitance of the FET.

The voltage generated between the source and the gate of the FET is shown in FIG. 3B. In the voltage generated in the gate of the FET, a gate high level voltage 31 is clipped around 0 V by the diode as the component of this embodiment. At a falling timing 28 of the driving signal, the swing range of the driving signal is voltage-divided by the input capacitance of the FET and the capacitance of the capacitor as the component of this embodiment, such that the gate voltage of the FET is decreased to a gate low level voltage 32. Accordingly, a negative voltage is generated in the gate voltage, such that the FET can be turned off.

Subsequently, at a rising timing 29 of the driving signal, the swing range of the driving signal is voltage-divided by the input capacitance of the FET and the capacitance of the capacitor as the component of this embodiment, such that the gate voltage of the FET is increased to the gate high level voltage 31. Accordingly, the FET is turned on.

FIG. 4 illustrates the simulation results of the driving signal and the gate voltage of the FET when the capacitance of the capacitor as the component of this embodiment is equal to the input capacitance of the FET. The voltage-division ratio with respect to the swing range of the driving signal is changed and the swing range of the gate voltage is decreased in accordance with a decrease in the capacitance of the capacitor. For this reason, the gate low level voltage 38 is closer to 0 V than the gate low level voltage 32. However, as in the simulation results of FIG. 3, since a negative voltage is generated in the gate voltage at the low level of the driving signal, the FET can be turned off. As described above, according to the semiconductor device according to this embodiment, a switching operation can be performed by only a semiconductor device using a single power supply even in the semiconductor device having a normally-on type element. Accordingly, since the number of components disposed on the circuit board is decreased, a compact circuit can be realized.

Next, the appropriate configuration of this embodiment will be described. It is desirable that the capacitance of the capacitor 12 is 1 to 9 times the input capacitance of the FET. Since a reason that the swing range of the voltage of the element driving signal (for example, the rectangular wave shown in FIGS. 3A and 4A) is voltage-divided by the input capacitance of the FET and the capacitance of the capacitor, when the capacitance of the capacitor becomes smaller than 1 time, the swing range of the voltage applied to the gate of the FET becomes smaller than the swing range of the voltage of the capacitor. For this reason, it is difficult to switch the FET to be turned on or off by the swing of the voltage applied to the gate of the FET. Accordingly, it is desirable that the capacitance of the capacitor 12 is 1 or more times the input capacitance of the PET.

Further, when the capacitance of the capacitor is more than 9 times the input capacitance of the FET, a decrease amount of the magnitude of the swing of the voltage applied to the gate of the FET is $\frac{1}{10}$ or less with respect to the swing of the voltage of the element driving signal, and substantially the magnitude of the swing of the voltage of the element driving signal is directly applied to the gate of the FET. For this reason, when the capacitance of the capacitor is 9 times or less the input capacitance of the FET, the swing range of the voltage of the element driving signal can effectively be transmitted to the gate of the FET and the small capacitor can be integrated on the same chip. Accordingly, a control can be performed by only the semiconductor device including the normally-on type FET according to this embodiment using the single power supply.

Furthermore, since the capacitance of the capacitor is 9 times or less the input capacitance of the FET, a dielectric substance having low permittivity can be used in the insulation film of the capacitor. Also, when the insulation film of the capacitor is formed using the same material with the interlayer insulation film of the FET, the fabrication process can be simplified and various dielectric substances can be used.

In this embodiment, it is desirable that the FET formed of the nitride semiconductor or SiC is used. Since the FET formed of the nitride semiconductor or SiC has a small input capacitance, the capacitance of the capacitor can be made small, thereby forming the capacitor on the same chip along with the FET. In addition, since the FET formed of the nitride semiconductor can perform a high-speed switching operation, an advantage of reducing the influence of charge leakage of the capacitor caused by leakage resistance can be obtained.

According to this embodiment, it is possible to fabricate the semiconductor device in which the capacitor and the diode are disposed on the same chip, and which can be solely operated by a single power supply. Since the components are formed on the same chip, it is possible to decrease the number of components, and to remarkably shorten the wiring length. When an abrupt variation in the current (for example, a variation in the current with a variation in the signal upon switching the element) occurs between the element and the element driving circuit due to the parasitic inductance L generated in the wiring, the voltage is generated as expressed by an equation below:

$$-L\frac{dI}{dt}$$ [Equation]

where, I represents the current flowing in the wiring, and t represents the time.

At this time, voltage oscillation (ringing) is generated by oscillation with floating capacitance of the wiring. Accordingly, the voltage oscillation has an adverse effect on the switching element or the driving circuit of the element, thereby causing noise. Since the voltage generated by the abrupt variation in the current is proportional to the parasitic inductance L of the wiring, the electromotive force can be very effectively suppressed by a remarkable decrease in the wiring length according to this embodiment.

In particular, since the capacitor is disposed on the gate drawn electrode, the chip can be decreased in size. As a result, the ringing is effectively suppressed.

Second Embodiment

Figure 5:
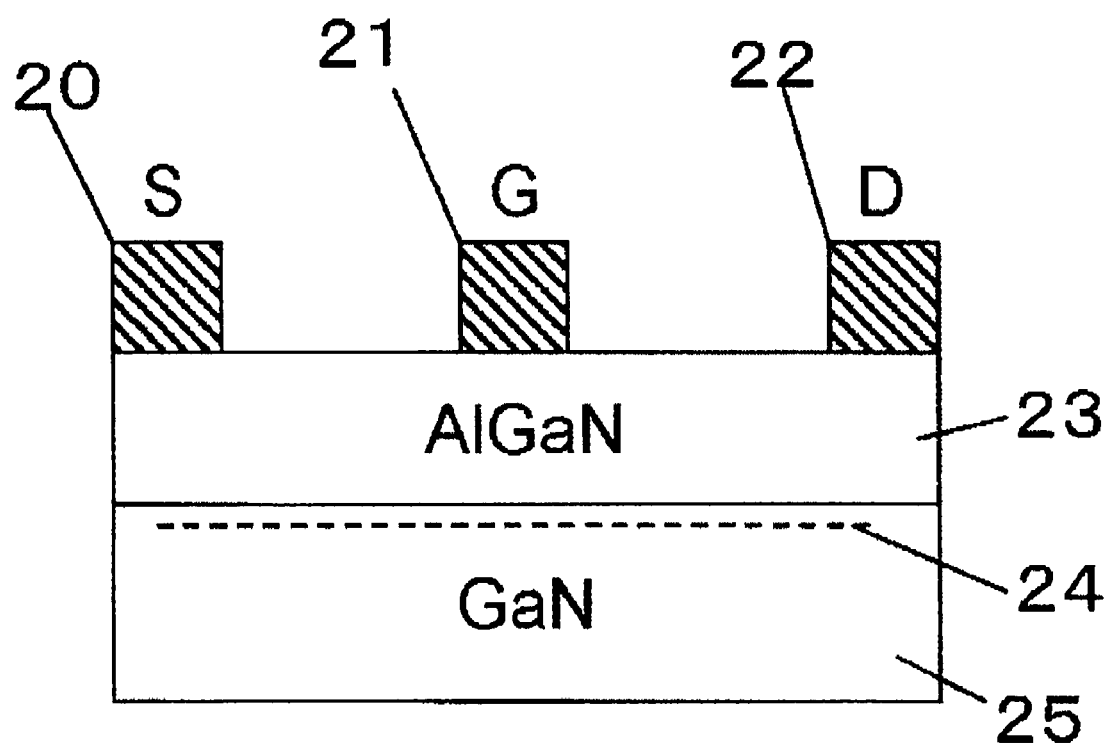
FIG. 5 is a cross-sectional view illustrating an example of the nitride semiconductor HEMT.

A semiconductor device according to a second embodiment is different from that of the first embodiment in that the gate insulation film 26 is not provided. That is, the gate insulation film is omitted in the cross-sectional view of the nitride semiconductor as shown in FIG. 5. In this case, when the gate electrode 21 comes into Schottky contact with the nitride semiconductor, a switching operation can be performed by only the semiconductor device using a single power supply as in the first example. Accordingly, since the number of components disposed on the circuit board is decreased, a compact circuit can be realized.

In the semiconductor device according to the second embodiment, since a parasitic diode is formed in the FET section while having a forward direction from the gate to the source, the gate of the FET can serve as a Schottky barrier diode, and hence the same effect as that of the diode 19 can be expected. For this reason, the diode 19 can be omitted by the gate electrode 21.

Third Embodiment

Figure 6:
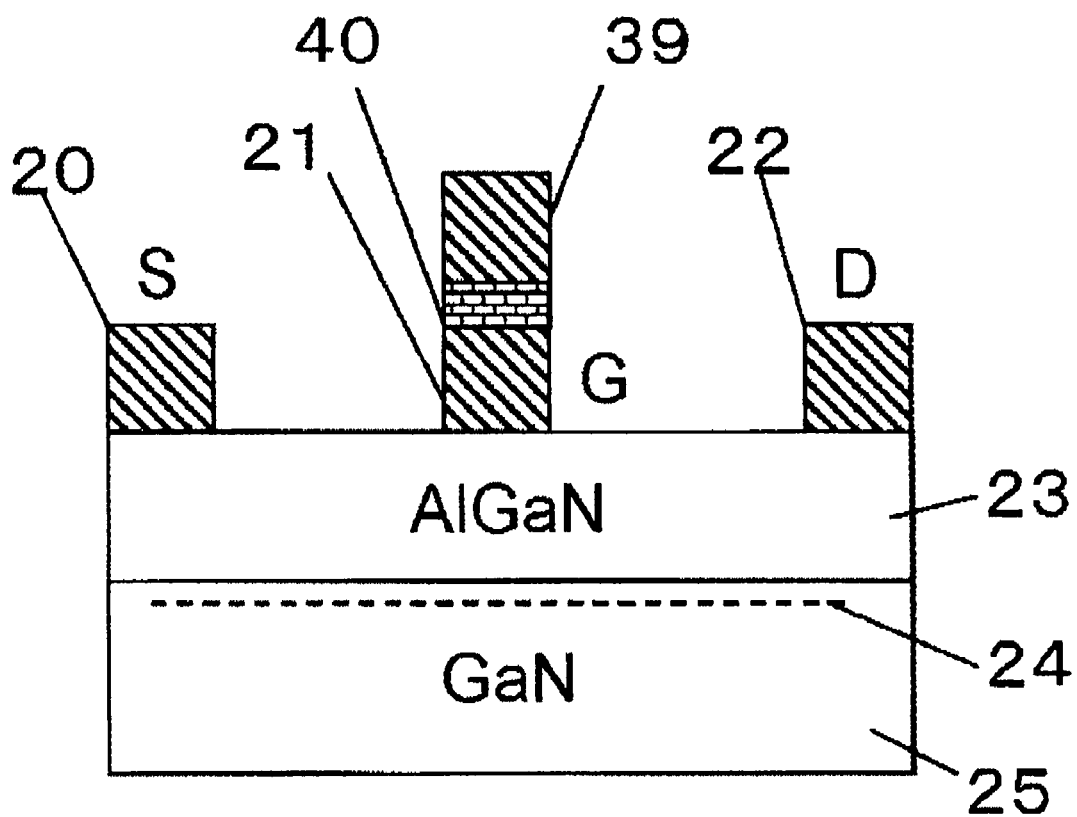
FIG. 6 is a cross-sectional view illustrating an example of the nitride semiconductor HEMT according to a third embodiment.
Figure 7:
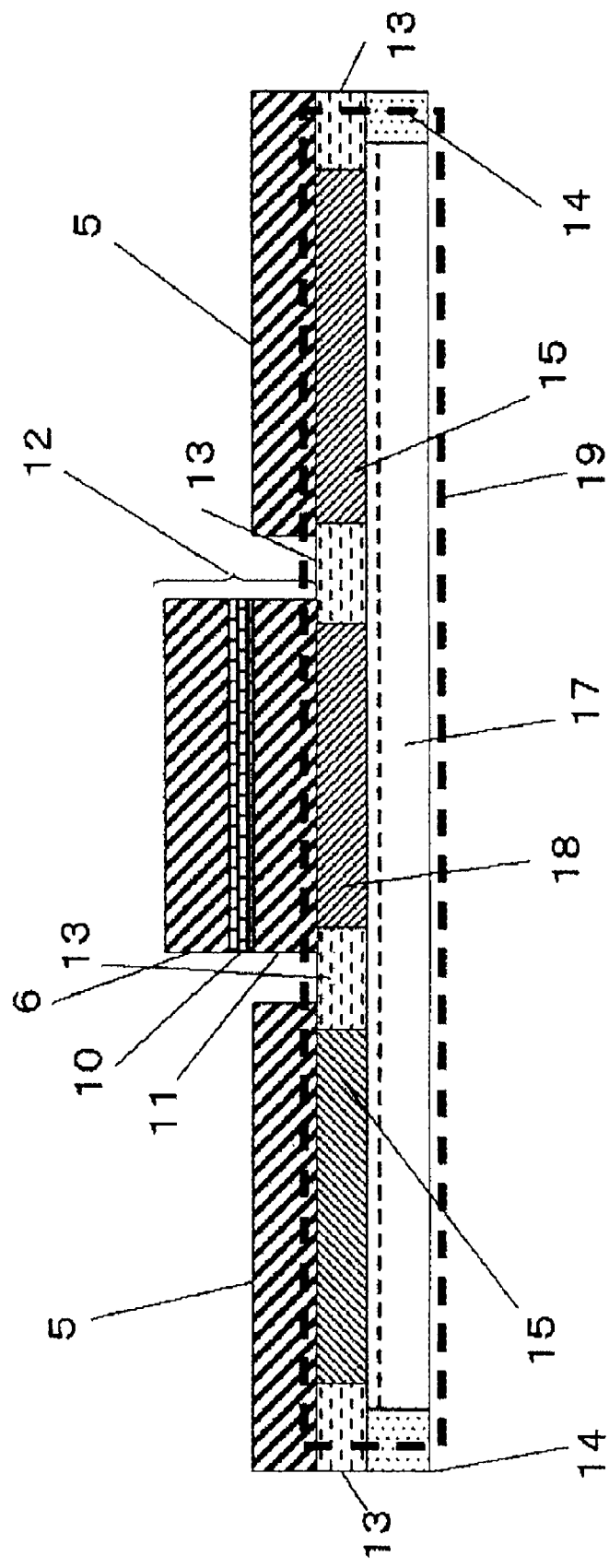
FIG. 7 is a cross-sectional view illustrating an example of the nitride semiconductor HEMT according to a fourth embodiment.

A semiconductor device according to a third embodiment is different from those of the first and second embodiments in that an electrode 39 is formed on the gate electrode 21 with a dielectric insulation film 40 interposed therebetween. As shown in FIG. 6, the dielectric insulation film 40 is formed on the gate electrode 21 of the FET section, and the electrode 39 is formed on the dielectric insulation film 40. Accordingly, when the capacitor is formed inside the FET by the gate electrode 21, the dielectric insulation layer 40, and the electrode 39, it is possible to form the capacitor having one electrode electrically connected to the gate of the FET, and the other electrode electrically connected to the input terminal. Accordingly, since the capacitor can be formed in the FET section in addition to the capacitor electrode 6, the area of the chip can be decreased.

Fourth Embodiment

A semiconductor device of a fourth embodiment is different from those of the first to third embodiments in that the anode electrode 18 beneath the gate electrode drawn pad 6 is integrally formed. Accordingly, the electrode section can be increased in size, and on-resistances of the diode can be decreased. Further, the on-resistances can be decreased by widening the cathode electrode.

While the embodiments have been described, the embodiment is not limited thereto as long as the normally-on type FET, the capacitor having one electrode electrically connected to the gate of the FET and the other electrode electrically connected to the input terminal, and the diode having the anode electrode electrically connected to the gate of the FET and the cathode electrode electrically connected to the source of the FET are formed on the same chip on which the FET is formed. For example, the capacitor of the first or third embodiment is formed by double layers of electrodes and single layer of insulator, but the capacitance thereof may be increased by laminating multiple layers. In addition, the source electrode, the drain electrode, and the gate electrode of the FET section are disposed in a pectinate shape, but may be disposed in a lattice shape, a concentric circle shape, a honeycomb structure shape, or a radial shape. In addition, the source electrode pads, the gate electrode pads, and the drain electrode pads may be plurally disposed. For this reason, a plurality of capacitors or diodes may be disposed at an arbitrary place.

While certain embodiments have been described, these embodiments have been presented by way of example only, and are note intended to limit the scope of the inventions. Indeed, the novel device described herein may be embodied in a variety of other forms; furthermore, various omissions, substitutions and changes in the form of the device described herein may be made without departing from the spirit of the inventions. The accompanying claims and their equivalents are intended to cover such forms or modifications as would fall within the scope and spirit of the inventions.

What is claimed is:

1. The semiconductor device comprising:
   a normally-on type FET;
   a capacitor having one electrode electrically connected to a gate of the FET and the other electrode electrically connected to an input terminal; and
   a diode having an anode electrode electrically connected to the gate of the FET and a cathode electrode electrically connected to a source of the FET, wherein the capacitor is formed by forming a metallic layer on a gate drawn electrode of the FET with a dielectric insulation layer interposed therebetween, the FET, the capacitor, and the diode are formed on the same chip, and the capacitance of the capacitor connected to the gate is set to be 1 to 9 times the input capacitance of the FET.

2. The semiconductor device according to claim 1, wherein the normally-on type FET is formed of a nitride semiconductor or SiC.

3. The semiconductor device according to claim 1, wherein the normally-on type FET has a structure in which a gate electrode comes into Schottky contact with a nitride semiconductor or SiC.

4. The semiconductor device according to claim 1, wherein the insulation film of the capacitor is formed using the same material as the interlayer insulation film of the FET.

5. The semiconductor device according to claim 1, further comprising:
a capacitor in which an electrode is formed on a surface of a gate electrode of the normally-on type FET with a dielectric insulation film interposed therebetween.

* * * * *